(12) United States Patent
Luo et al.

(10) Patent No.: US 9,119,307 B2
(45) Date of Patent: Aug. 25, 2015

(54) HOUSING FOR A PORTABLE ELECTRONIC DEVICE

(71) Applicant: Ticona LLC, Florence, KY (US)

(72) Inventors: Rong Luo, Florence, KY (US); Xinyu Zhao, Cincinnati, OH (US); Ke Feng, Cincinnati, OH (US)

(73) Assignee: Ticona LLC, Florence, KY (US)

( * ) Notice: Subject to any disclaimer, the term of this patent is extended or adjusted under 35 U.S.C. 154(b) by 201 days.

(21) Appl. No.: 13/621,865

(22) Filed: Sep. 18, 2012

(65) Prior Publication Data

US 2013/0249357 A1    Sep. 26, 2013

Related U.S. Application Data

(60) Provisional application No. 61/536,721, filed on Sep. 20, 2011, provisional application No. 61/576,409, filed on Dec. 16, 2011.

(51) Int. Cl.
| | | |
|---|---|---|
| *C08K 3/34* | (2006.01) |
| *H05K 5/03* | (2006.01) |
| *C08K 5/372* | (2006.01) |
| *C08G 75/02* | (2006.01) |
| *C08K 7/02* | (2006.01) |

(52) U.S. Cl.
CPC .............. *H05K 5/03* (2013.01); *C08G 75/029* (2013.01); *C08K 5/372* (2013.01); *C08K 7/02* (2013.01)

(58) Field of Classification Search
CPC ........ C08K 5/372; C08K 7/02; C08G 75/029; H05K 5/03; C08L 81/02
USPC ................................................. 524/442, 494
See application file for complete search history.

(56) References Cited

U.S. PATENT DOCUMENTS

| | | | |
|---|---|---|---|
| 3,725,362 A | 4/1973 | Walker |
| 3,729,404 A | 4/1973 | Morgan |
| 4,021,596 A | 5/1977 | Bailey |
| 4,119,617 A | 10/1978 | Hanyuda et al. |
| 4,276,397 A | 6/1981 | Froix |
| 4,436,865 A * | 3/1984 | Beever ........................... 524/504 |
| 4,605,713 A | 8/1986 | Heitz et al. |
| 4,678,831 A | 7/1987 | Kawabata et al. |
| 4,760,128 A | 7/1988 | Ebert et al. |
| 4,769,424 A | 9/1988 | Takekoshi et al. |
| 4,820,801 A | 4/1989 | Inoue et al. |
| 4,889,893 A | 12/1989 | Kobayashi et al. |
| 4,935,473 A | 6/1990 | Fukuda et al. |
| 5,015,703 A | 5/1991 | Takekoshi et al. |
| 5,015,704 A | 5/1991 | Takekoshi et al. |
| 5,047,465 A | 9/1991 | Auerbach |
| 5,057,264 A | 10/1991 | Bier et al. |
| 5,068,312 A | 11/1991 | Dorf et al. |
| 5,070,127 A | 12/1991 | Auerbach |
| 5,122,578 A | 6/1992 | Han et al. |
| 5,151,458 A | 9/1992 | Heinz et al. |
| 5,182,334 A | 1/1993 | Chen, Sr. et al. |
| 5,218,043 A | 6/1993 | Kubota et al. |
| 5,227,427 A | 7/1993 | Seizawa et al. |
| 5,276,107 A | 1/1994 | Kim et al. |
| 5,384,196 A | 1/1995 | Inoue et al. |
| 5,418,281 A | 5/1995 | Yung et al. |
| 5,436,300 A | 7/1995 | Kashiwadate et al. |
| 5,488,084 A | 1/1996 | Kadoi et al. |
| 5,504,141 A | 4/1996 | Collard et al. |
| 5,541,243 A | 7/1996 | Ohmura et al. |
| 5,652,287 A | 7/1997 | Sullivan et al. |
| 5,654,383 A | 8/1997 | Kohler et al. |
| 5,679,284 A | 10/1997 | Kurita |
| 5,780,583 A | 7/1998 | Lubowitz et al. |
| 5,959,071 A | 9/1999 | DeMoss et al. |
| 5,981,007 A | 11/1999 | Rubin et al. |
| 5,997,765 A | 12/1999 | Furuta et al. |
| 6,001,934 A | 12/1999 | Yamanaka et al. |
| 6,010,760 A | 1/2000 | Miyazaki et al. |
| 6,080,822 A | 6/2000 | Haubs et al. |
| 6,117,950 A | 9/2000 | Yamao et al. |
| 6,130,292 A | 10/2000 | Harwood et al. |
| 6,201,098 B1 | 3/2001 | Haubs et al. |
| 6,280,668 B1 | 8/2001 | Saito et al. |

(Continued)

FOREIGN PATENT DOCUMENTS

| | | |
|---|---|---|
| CN | 101768358 | 7/2010 |
| CN | 102140233 | 8/2011 |
| CN | 102181156 | 9/2011 |
| CN | 102532898 | 7/2012 |
| DE | 3813919 | 11/1989 |
| DE | 4138906 | 6/1993 |
| EP | 0 225 471 A1 | 6/1987 |
| EP | 0405135 | 1/1991 |
| EP | 0432561 | 6/1991 |
| EP | 0546185 | 6/1993 |
| EP | 0549977 | 7/1993 |
| EP | 0568945 | 11/1993 |
| JP | 03-231969 A | 10/1991 |

(Continued)

OTHER PUBLICATIONS

Jul. 24, 2013 International Search Report and Written Opinion of application PCT/US2012/055856.

(Continued)

*Primary Examiner* — Edward Cain
(74) *Attorney, Agent, or Firm* — Dority & Manning, P.A.

(57) ABSTRACT

An injection molded housing for a portable electronic device is provided. The housing contains a thermoplastic composition that includes a polyarylene sulfide melt processed in the presence of a disulfide compound and a filler. Without intending to be limited by theory, it is believed that the disulfide can undergo a chain scission reaction with the starting polyarylene sulfide to lower its melt viscosity, which can lead to decreased attrition of the filler and thus improved mechanical properties. Due to this ability to reduce viscosity during melt processing, the present inventors have discovered that relatively high molecular weight polyarylene sulfides can be fed to the extruder with little difficulty.

33 Claims, 3 Drawing Sheets

(56) References Cited

U.S. PATENT DOCUMENTS

| | | |
|---|---|---|
| 6,317,314 B1 | 11/2001 | Kung et al. |
| 6,339,400 B1 | 1/2002 | Flint et al. |
| 6,476,106 B1 | 11/2002 | Murakami et al. |
| 6,608,136 B1 | 8/2003 | Dean et al. |
| 6,645,623 B2 | 11/2003 | Dean et al. |
| 6,699,946 B1 | 3/2004 | Lambla et al. |
| 6,730,378 B2 | 5/2004 | Matsuoka et al. |
| 6,793,847 B2 | 9/2004 | Maeda et al. |
| 6,830,792 B1 | 12/2004 | Matsuoka et al. |
| 6,875,517 B2 | 4/2005 | Bosshammer et al. |
| 6,889,719 B2 | 5/2005 | Watanabe et al. |
| 6,900,272 B2 | 5/2005 | Matsuoka et al. |
| 6,960,628 B2 | 11/2005 | Matsuoka et al. |
| 7,115,312 B2 | 10/2006 | Matsuoka et al. |
| 7,118,691 B2 | 10/2006 | Elkovitch et al. |
| 7,169,887 B2 | 1/2007 | Papke |
| 7,235,612 B2 | 6/2007 | Kobayashi et al. |
| 7,271,769 B2 | 9/2007 | Asano et al. |
| 7,301,783 B2 | 11/2007 | Homer et al. |
| 7,303,822 B1 | 12/2007 | Matsuoka et al. |
| 7,385,806 B2 | 6/2008 | Liao |
| 7,462,672 B2 | 12/2008 | Kobayashi et al. |
| 7,486,243 B2 | 2/2009 | Wulff et al. |
| 7,486,517 B2 | 2/2009 | Aapro et al. |
| 7,518,568 B2 | 4/2009 | Tracy et al. |
| 7,553,925 B2 | 6/2009 | Bojkova |
| 7,608,666 B2 | 10/2009 | Matsuoka et al. |
| 7,960,473 B2 | 6/2011 | Kobayashi et al. |
| 7,974,660 B2 | 7/2011 | Hsu et al. |
| 7,989,079 B2 | 8/2011 | Lee et al. |
| 8,005,429 B2 | 8/2011 | Conway et al. |
| 8,026,309 B2 | 9/2011 | Halahmi et al. |
| 8,044,142 B2 | 10/2011 | Akiyama et al. |
| 8,076,423 B2 | 12/2011 | Ishio et al. |
| 8,152,071 B2 | 4/2012 | Doherty et al. |
| 8,168,732 B2 | 5/2012 | Ajbani et al. |
| 8,258,242 B2 | 9/2012 | Hiroi et al. |
| 8,338,547 B2 | 12/2012 | Takahashi et al. |
| 8,367,210 B2 | 2/2013 | Naritomi et al. |
| 8,426,552 B2 | 4/2013 | Hinokimori et al. |
| 8,462,054 B2 | 6/2013 | Yang et al. |
| 2003/0050091 A1 | 3/2003 | Tsai et al. |
| 2004/0257283 A1 | 12/2004 | Asano et al. |
| 2005/0104190 A1 | 5/2005 | Mithal et al. |
| 2006/0257624 A1 | 11/2006 | Naritomi et al. |
| 2009/0011163 A1 | 1/2009 | Ajbani |
| 2009/0267266 A1 | 10/2009 | Lee et al. |
| 2009/0280347 A1 | 11/2009 | Yu |
| 2010/0048777 A1 | 2/2010 | Kodama et al. |
| 2010/0249342 A1 | 9/2010 | Unohara et al. |
| 2011/0037193 A1 | 2/2011 | Takada et al. |
| 2011/0089792 A1 | 4/2011 | Casebolt et al. |
| 2011/0090630 A1 | 4/2011 | Bergerone et al. |
| 2011/0134012 A1 | 6/2011 | Yang et al. |
| 2011/0169700 A1 | 7/2011 | Degner et al. |
| 2012/0065361 A1 | 3/2012 | Konno et al. |
| 2012/0237714 A1 | 9/2012 | Nishikawa et al. |
| 2013/0035440 A1 | 2/2013 | Nishikawa et al. |
| 2013/0059976 A1 | 3/2013 | Matsuo et al. |
| 2013/0069001 A1 | 3/2013 | Luo et al. |
| 2013/0071638 A1 | 3/2013 | Luo et al. |
| 2013/0072629 A1 | 3/2013 | Luo et al. |
| 2013/0072630 A1 | 3/2013 | Luo et al. |
| 2013/0225771 A1 | 8/2013 | Kanomata et al. |

FOREIGN PATENT DOCUMENTS

| | | |
|---|---|---|
| JP | 05-086266 A | 4/1993 |
| JP | 05-170907 A | 7/1993 |
| JP | 05-230371 A | 9/1993 |
| JP | 08-151518 A | 6/1996 |
| JP | 11-140315 A | 5/1999 |
| JP | 2980054 B | 11/1999 |
| JP | 3034335 B | 4/2000 |
| JP | 2001-172501 A | 6/2001 |
| JP | 3227729 B | 11/2001 |
| JP | 2004/182754 A | 7/2004 |
| JP | 3579957 B | 10/2004 |
| JP | 3601090 B | 12/2004 |
| JP | 3637715 B | 4/2005 |
| JP | 3800783 B | 7/2006 |
| JP | 2006-316207 A | 11/2006 |
| JP | 3867549 B | 1/2007 |
| JP | 2007-197714 A | 8/2007 |
| JP | 2007-277292 A | 10/2007 |
| JP | 4038607 B | 1/2008 |
| JP | 412967 B | 8/2008 |
| JP | 4196647 B | 12/2008 |
| JP | 2009-256480 A | 11/2009 |
| JP | 2009-263635 A | 11/2009 |
| JP | 2010-053356 A | 3/2010 |
| JP | 2010-070706 A | 4/2010 |
| JP | 2010-084125 A | 4/2010 |
| JP | 4495261 B | 6/2010 |
| JP | 2010-195874 A | 9/2010 |
| JP | 4552315 B | 9/2010 |
| JP | 4943399 B | 5/2012 |
| JP | 5029881 B | 9/2012 |
| WO | WO 2009/033349 | 3/2009 |
| WO | WO 2009128260 A1 | 10/2009 |

OTHER PUBLICATIONS

Chinese Search Report dated Jun. 2, 2015, 2 pages.

* cited by examiner

HOUSING FOR A PORTABLE ELECTRONIC DEVICE

CROSS REFERENCE TO RELATED APPLICATION

The present application claims filing benefit of U.S. Provisional Patent Application Ser. No. 61/536,721 having a filing date of Sep. 20, 2011, and U.S. Provisional Patent Application Ser. No. 61/576,409 having a filing date of Dec. 16, 2011, both of which are incorporated herein by reference.

BACKGROUND OF THE INVENTION

Portable electronic devices, such as notebook computers, mobile phones, and personal digital assistants (PDAs), often include injection molded housings for protecting electrical components, such as antennae for receiving and/or transmitting communication signals, displays, etc. As the demand for thinner devices has increased, so has the demand for higher performance plastic materials that can be injection molded into the desired configurations. One such material is polyphenylene sulfide ("PPS"), which is a high performance polymer that can withstand high thermal, chemical, and mechanical stresses. PPS is generally formed via polymerization of p-dichlorobenzene with an alkali metal sulfide or an alkali metal hydrosulfide, forming polymers that include chlorine at the terminal groups. Nevertheless, a problem often experienced by conventional PPS compositions is that they contain a residual amount of chlorine from to the polymerization process. For portable electronic devices, however, the presence of a significant amount of chlorine is problematic due to environmental concerns. Attempts at eliminating the presence of chlorine have generally involved the use of higher molecular weight polymers having a low chlorine content. Unfortunately, such polymers also have a high melt viscosity, which makes them difficult to melt process and mold into thin parts. This problem is aggravated by the addition of fillers that can even further increase the melt viscosity of the composition.

As such, a need currently exists for a housing for a portable electronic device that contains a polyarylene sulfide having a relatively low melt viscosity and low chlorine content, while still providing good mechanical properties.

SUMMARY OF THE INVENTION

In accordance with one embodiment of the present invention, an injection molded housing for a portable electronic device is disclosed. The housing comprises a thermoplastic composition containing a polyarylene sulfide that is melt processed in the presence of a disulfide compound and a filler. The composition has a melt viscosity of about 2500 poise or less as determined in accordance with ISO Test No. 11443 at a shear rate of 1200 $s^{-1}$ and at a temperature of 310° C., and the composition has a chlorine content of about 1200 parts per million or less.

In accordance with another embodiment of the present invention, a portable computer is disclosed that comprises a housing that includes a display member. At least a portion of the housing contains a molded part having a thickness of about 100 millimeters or less. The molded part is formed from a thermoplastic composition containing a polyarylene sulfide, disulfide compound, and a filler, and the composition has a chlorine content of about 1200 parts per million or less.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
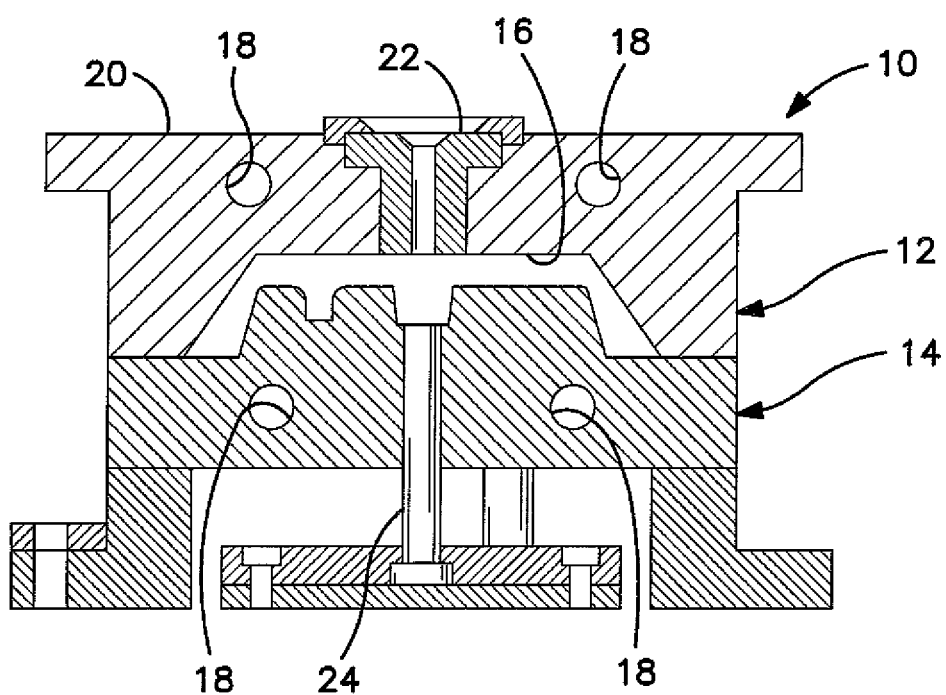
FIG. 1 is a cross-sectional view of one embodiment of an injection mold apparatus that may be employed in the present invention.

It is to be understood by one of ordinary skill in the art that the present discussion is a description of exemplary embodiments only, and is not intended as limiting the broader aspects of the present invention.

Generally speaking, the present invention is directed to an injection molded housing for a portable electronic device. The housing contains a thermoplastic composition that includes a polyarylene sulfide melt processed in the presence of a disulfide compound and a filler. Without intending to be limited by theory, it is believed that the disulfide can undergo a chain scission reaction with the starting polyarylene sulfide to lower its melt viscosity, which can lead to decreased attrition of the filler and thus improved mechanical properties. Due to this ability to reduce viscosity during melt processing, the present inventors have discovered that relatively high molecular weight polyarylene sulfides can be fed to the extruder with little difficulty. One benefit of using such high molecular weight polymers is that they generally have a low chlorine content. In this regard, the resulting thermoplastic composition can thus have a very low chlorine content, which is a particularly important feature for portable electronic devices. For example, the thermoplastic composition may have a chlorine content of about 1200 ppm or less, in some embodiments about 900 ppm or less, in some embodiments from 0 to about 800 ppm, and in some embodiments, from about 1 to about 500 ppm.

The thermoplastic composition can exhibit other beneficial characteristics as well. For instance, the composition can exhibit good heat resistance and flame retardant characteristics. For instance, the composition can meet the V-0 flammability standard at a thickness of 0.8 millimeters. The flame retarding efficacy may be determined according to the UL 94 Vertical Burn Test procedure of the "Test for Flammability of Plastic Materials for Parts in Devices and Appliances", 5th Edition, Oct. 29, 1996. The ratings according to the UL 94 test are listed in the following table:

| Rating | Afterflame Time (s) | Burning Drips | Burn to Clamp |
| --- | --- | --- | --- |
| V-0 | <10 | No | No |
| V-1 | <30 | No | No |
| V-2 | <30 | Yes | No |
| Fail | <30 | | Yes |
| Fail | >30 | | No |

The "afterflame time" is an average value determined by dividing the total afterflame time (an aggregate value of all samples tested) by the number of samples. The total afterflame time is the sum of the time (in seconds) that all the samples remained ignited after two separate applications of a flame as described in the UL-94 VTM test. Shorter time periods indicate better flame resistance, i.e., the flame went out faster. For a V-0 rating, the total afterflame time for five (5) samples, each having two applications of flame, must not exceed 50 seconds. Using the flame retardant of the present invention, articles may achieve at least a V-1 rating, and typically a V-0 rating, for specimens having a thickness of 0.8 millimeters.

Various embodiments of the present invention will now be described in greater detail below.

I. Thermoplastic Composition

A. Polyarylene Sulfide

As noted above, the thermoplastic composition contains at least one polyarylene sulfide, which is generally able to withstand relatively high temperatures without melting. Although the actual amount may vary depending on desired application, polyarylene sulfide(s) typically constitute from about 30 wt % to about 95 wt. %, in some embodiments from about 35 wt. % to about 90 wt. %, and in some embodiments, from about 40 wt. % to about 80 wt. % of the thermoplastic composition. The polyarylene sulfide(s) generally have repeating units of the formula:

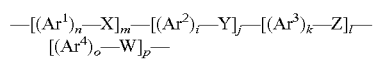

wherein, $Ar^1$, $Ar^2$, $Ar^3$, and $Ar^4$ are independently arylene units of 6 to 18 carbon atoms;

W, X, Y, and Z are independently bivalent linking groups selected from —$SO_2$—, —S—, —SO—, —CO—, —O—, —C(O)O— or alkylene or alkylidene groups of 1 to 6 carbon atoms, wherein at least one of the linking groups is —S—; and n, m, i, j, k, l, o, and p are independently 0, 1, 2, 3, or 4, subject to the proviso that their sum total is not less than 2.

The arylene units $Ar^1$, $Ar^2$, $Ar^3$, and $Ar^4$ may be selectively substituted or unsubstituted. Advantageous arylene units are phenylene, biphenylene, naphthylene, anthracene and phenanthrene. The polyarylene sulfide typically includes more than about 30 mol %, more than about 50 mol %, or more than about 70 mol % arylene sulfide (—S—) units. For example, the polyarylene sulfide may include at least 85 mol % sulfide linkages attached directly to two aromatic rings. In one particular embodiment, the polyarylene sulfide is a polyphenylene sulfide, defined herein as containing the phenylene sulfide structure —($C_6H_4$—S)$_n$— (wherein n is an integer of 1 or more) as a component thereof.

Synthesis techniques that may be used in making a polyarylene sulfide are generally known in the art. By way of example, a process for producing a polyarylene sulfide can include reacting a material that provides a hydrosulfide ion (e.g., an alkali metal sulfide) with a dihaloaromatic compound in an organic amide solvent. The alkali metal sulfide can be, for example, lithium sulfide, sodium sulfide, potassium sulfide, rubidium sulfide, cesium sulfide or a mixture thereof. When the alkali metal sulfide is a hydrate or an aqueous mixture, the alkali metal sulfide can be processed according to a dehydrating operation in advance of the polymerization reaction. An alkali metal sulfide can also be generated in situ. In addition, a small amount of an alkali metal hydroxide can be included in the reaction to remove or react impurities (e.g., to change such impurities to harmless materials) such as an alkali metal polysulfide or an alkali metal thiosulfate, which may be present in a very small amount with the alkali metal sulfide.

The dihaloaromatic compound can be, without limitation, an o-dihalobenzene, m-dihalobenzene, p-dihalobenzene, dihalotoluene, dihalonaphthalene, methoxy-dihalobenzene, dihalobiphenyl, dihalobenzoic acid, dihalodiphenyl ether, dihalodiphenyl sulfone, dihalodiphenyl sulfoxide or dihalodiphenyl ketone. Dihaloaromatic compounds may be used either singly or in any combination thereof. Specific exemplary dihaloaromatic compounds can include, without limitation, p-dichlorobenzene; m-dichlorobenzene; o-dichlorobenzene; 2,5-dichlorotoluene; 1,4-dibromobenzene; 1,4-dichloronaphthalene; 1-methoxy-2,5-dichlorobenzene; 4,4'-dichlorobiphenyl; 3,5-dichlorobenzoic acid; 4,4'-dichlorodiphenyl ether; 4,4'-dichlorodiphenylsulfone; 4,4'-dichlorodiphenylsulfoxide; and 4,4'-dichlorodiphenyl ketone. The halogen atom can be fluorine, chlorine, bromine or iodine, and two halogen atoms in the same dihalo-aromatic compound may be the same or different from each other. In one embodiment, o-dichlorobenzene, m-dichlorobenzene, p-dichlorobenzene or a mixture of two or more compounds thereof is used as the dihalo-aromatic compound. As is known in the art, it is also possible to use a monohalo compound (not necessarily an aromatic compound) in combination with the dihaloaromatic compound in order to form end groups of the polyarylene sulfide or to regulate the polymerization reaction and/or the molecular weight of the polyarylene sulfide.

The polyarylene sulfide(s) may be homopolymers or copolymers. For instance, selective combination of dihaloaromatic compounds can result in a polyarylene sulfide copolymer containing not less than two different units. For instance, when p-dichlorobenzene is used in combination with m-dichlorobenzene or 4,4'-dichlorodiphenylsulfone, a polyarylene sulfide copolymer can be formed containing segments having the structure of formula:

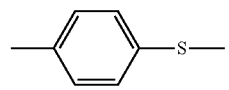

and segments having the structure of formula:

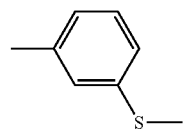

or segments having the structure of formula:

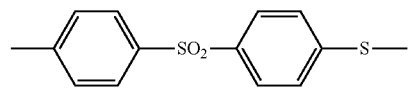

In another embodiment, a polyarylene sulfide copolymer may be formed that includes a first segment with a number-average molar mass Mn of from 1000 to 20,000 g/mol. The first segment may include first units that have been derived from structures of the formula:

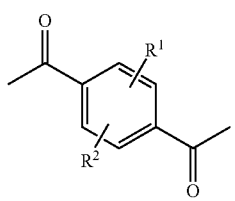

where the radicals $R^1$ and $R^2$, independently of one another, are a hydrogen, fluorine, chlorine or bromine atom or a branched or unbranched alkyl or alkoxy radical having from 1 to 6 carbon atoms; and/or second units that are derived from structures of the formula:

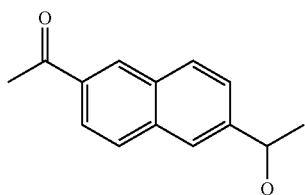 [SMILES: CC(=O)c1ccc2cc(C(C)O)ccc2c1]

The first unit may be p-hydroxybenzoic acid or one of its derivatives, and the second unit may be composed of 2-hydroxynaphthalene-6-carboxylic acid. The second segment may be derived from a polyarylene sulfide structure of the formula:

$$—[Ar—S]_q—$$

where Ar is an aromatic radical, or more than one condensed aromatic radical, and q is a number from 2 to 100, in particular from 5 to 20. The radical Ar may be a phenylene or naphthylene radical. In one embodiment, the second segment may be derived from poly(m-thiophenylene), from poly(o-thiophenylene), or from poly(p-thiophenylene).

The polyarylene sulfide(s) may be linear, semi-linear, branched or crosslinked. Linear polyarylene sulfides typically contain 80 mol % or more of the repeating unit —(Ar—S)—. Such linear polymers may also include a small amount of a branching unit or a cross-linking unit, but the amount of branching or cross-linking units is typically less than about 1 mol % of the total monomer units of the polyarylene sulfide. A linear polyarylene sulfide polymer may be a random copolymer or a block copolymer containing the above-mentioned repeating unit. Semi-linear polyarylene sulfides may likewise have a cross-linking structure or a branched structure introduced into the polymer a small amount of one or more monomers having three or more reactive functional groups. By way of example, monomer components used in forming a semi-linear polyarylene sulfide can include an amount of polyhaloaromatic compounds having two or more halogen substituents per molecule which can be utilized in preparing branched polymers. Such monomers can be represented by the formula R'$X_n$, where each X is selected from chlorine, bromine, and iodine, n is an integer of 3 to 6, and R' is a polyvalent aromatic radical of valence n which can have up to about 4 methyl substituents, the total number of carbon atoms in R' being within the range of 6 to about 16. Examples of some polyhaloaromatic compounds having more than two halogens substituted per molecule that can be employed in forming a semi-linear polyarylene sulfide include 1,2,3-trichlorobenzene, 1,2,4-trichlorobenzene, 1,3-dichloro-5-bromobenzene, 1,2,4-triiodobenzene, 1,2,3,5-tetrabromobenzene, hexachlorobenzene, 1,3,5-trichloro-2,4,6-trimethylbenzene, 2,2',4,4'-tetrachlorobiphenyl, 2,2',5,5'-tetra-iodobiphenyl, 2,2',6,6'-tetrabromo-3,3',5,5'-tetramethylbiphenyl, 1,2,3,4-tetrachloronaphthalene, 1,2,4-tribromo-6-methylnaphthalene, etc., and mixtures thereof.

B. Disulfide Compound

As indicated above, disulfide compounds are employed in the thermoplastic composition that can undergo a chain scission reaction with the polyarylene sulfide during melt processing to lower its overall melt viscosity. Disulfide compounds typically constitute from about 0.01 wt. % to about 3 wt. %, in some embodiments from about 0.02 wt. % to about 1 wt. %, and in some embodiments, from about 0.05 to about 0.5 wt. % of the thermoplastic composition. The ratio of the amount of the polyarylene sulfide to the amount of the disulfide compound may likewise be from about 1000:1 to about 10:1, from about 500:1 to about 20:1, or from about 400:1 to about 30:1. Suitable disulfide compounds are typically those having the following formula:

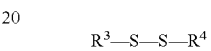

wherein $R^3$ and $R^4$ may be the same or different and are hydrocarbon groups that independently include from 1 to about 20 carbons. For instance, $R^3$ and $R^4$ may be an alkyl, cycloalkyl, aryl, or heterocyclic group. In certain embodiments, $R^3$ and $R^4$ are generally nonreactive functionalities, such as phenyl, naphthyl, ethyl, methyl, propyl, etc. Examples of such compounds include diphenyl disulfide, naphthyl disulfide, dimethyl disulfide, diethyl disulfide, and dipropyl disulfide. $R^3$ and $R^4$ may also include reactive functionality at terminal end(s) of the disulfide compound. For example, at least one of $R^3$ and $R^4$ may include a terminal carboxyl group, hydroxyl group, a substituted or non-substituted amino group, a nitro group, or the like. Examples of compounds may include, without limitation, 2,2'-diaminodiphenyl disulfide, 3,3'-diaminodiphenyl disulfide, 4,4'-diaminodiphenyl disulfide, dibenzyl disulfide, dithiosalicyclic acid (or 2,2'-dithiobenzoic acid), dithioglycolic acid, α,α'-dithiodilactic acid, β,β'-dithiodilactic acid, 3,3'-dithiodipyridine, 4,4'dithiomorpholine, 2,2'-dithiobis(benzothiazole), 2,2'-dithiobis(benzimidazole), 2,2'-dithiobis(benzoxazole), 2-(4'-morpholinodithio)benzothiazole, etc., as well as mixtures thereof.

C. Filler

In addition to the starting polyarylene sulfide and the disulfide component, a filler can be a component of the mixture to be melt processed. The filler may generally be included in the mixture an amount of from about 5 wt. % to about 80 wt. %, in some embodiment from about 10 wt. % to about 70 wt. %, and in some embodiments from about 15 wt. % to about 60 wt % of the thermoplastic composition. As indicated above, it is believed that the lower melt viscosity of the thermoplastic composition may prevent degradation of the filler, maintaining filler size and providing excellent strength characteristics to the composition.

In one embodiment, the filler can be a fibrous filler. The fibers are typically of a length from about 0.5 mm to about 5.0 mm. The fibrous filler may include one or more fiber types including, without limitation, polymer fibers, glass fibers, carbon fibers, metal fibers, and so forth, or a combination of fiber types. In one embodiment, the fibers may be chopped glass fibers or glass fiber rovings (tows).

Fiber diameters can vary depending upon the particular fiber used and are available in either chopped or continuous form. The fibers, for instance, can have a diameter of less than about 100 μm, such as less than about 50 μm. For instance, the fibers can be chopped or continuous fibers and can have a fiber diameter of from about 5 μm to about 50 μm, such as from about 5 μm to about 15 μm.

Fiber lengths can vary. In one embodiment, the fibers can have an initial length of from about 3 mm to about 5 mm. The melt processing conditions due to the combination of the disulfide compound with the starting polyarylene sulfide in the mixture can prevent excessive degradation of the added fibers and as a result the fibers can show less attrition during melt processing of the thermoplastic composition. For instance, the final fiber length in the melt processed composition can vary from about 200 μm to about 1500 μm, or from about 250 μm to about 1000 μm.

The fibers may be pretreated with a sizing that may also facilitate mixing with the starting polyarylene sulfide during melt processing of the thermoplastic composition.

In one embodiment, the fibers may have a high yield or small K numbers. The tow is indicated by the yield or K number. For instance, glass fiber tows may have 50 yield and up, for instance from about 115 yield to about 1200 yield.

Other fillers can alternatively be utilized or may be utilized in conjunction with a fibrous filler. For instance, a particulate filler can be incorporated in the thermoplastic composition. In general, particulate fillers can encompass any particulate material having a median particle size of less than about 750 μm, for instance less than about 500 μm, or less than about 100 μm. In one embodiment, a particulate filler can have a median particle size in the range of from about 3 μm to about 20 μm. In addition, a particulate filler can be solid or hollow, as is known. Particulate fillers can also include a surface treatment, as is known in the art.

When incorporating multiple fillers, for instance a particulate filler and a fibrous filler, the fillers may be added together or separately to the melt processing unit. For instance, a particulate filler can be added to the main feed with the polyarylene sulfide or downstream prior to addition of a fibrous filler, and a fibrous filler can be added further downstream of the addition point of the particulate filler. In general, a fibrous filler can be added downstream of any other fillers such as a particulate filler, though this is not a requirement.

When employed, particulate fillers typically constitute from about 5 wt. % to about 60 wt. %, in some embodiments from about 10 wt. % to about 50 wt. %, and in some embodiments, from about 15 wt. % to about 45 wt. % of the thermoplastic composition. Clay minerals may be particularly suitable for use in the present invention. Examples of such clay minerals include, for instance, talc ($Mg_3Si_4O_{10}(OH)_2$), halloysite ($Al_2Si_2O_5(OH)_4$), kaolinite ($Al_2Si_2O_5(OH)_4$), illite (($K,H_3O)(Al,Mg,Fe)_2(Si,Al)_4O_{10}[(OH)_2,(H_2O)]$), montmorillonite ($(Na,Ca)_{0.33}(Al,Mg)_2Si_4O_{10}(OH)_2 \cdot nH_2O$), vermiculite (($MgFe,Al)_3(Al,Si)_4O_{10}(OH)_2 \cdot 4H_2O$), palygorskite (($Mg,Al)_2Si_4O_{10}(OH) \cdot 4(H_2O)$)), pyrophyllite ($Al_2Si_4O_{10}(OH)_2$), etc., as well as combinations thereof. In lieu of, or in addition to, clay minerals, still other mineral fillers may also be employed. For example, other suitable silicate fillers may also be employed, such as calcium silicate, aluminum silicate, mica, diatomaceous earth, wollastonite, and so forth. Mica, for instance, may be a particularly suitable mineral for use in the present invention. There are several chemically distinct mica species with considerable variance in geologic occurrence, but all have essentially the same crystal structure. As used herein, the term "mica" is meant to generically include any of these species, such as muscovite ($KAl_2(AlSi_3)O_{10}(OH)_2$), biotite ($K(Mg,Fe)_3(AlSi_3)O_{10}(OH)_2$), phlogopite ($KMg_3(AlSi_3)O_{10}(OH)_2$), lepidolite ($K(Li,Al)_2-3(AlSi_3)O_{10}(OH)_2$), glauconite ($(K,Na)(Al,Mg,Fe)_2(Si,Al)_4O_{10}(OH)_2$), etc., as well as combinations thereof.

D. Other Additives

In addition to polyarylene sulfides, disulfides, and fillers, the thermoplastic composition may also contain a variety of other different components to help improve its overall properties. In certain embodiments, for example, a nucleating agent may be employed to further enhance the crystallization properties of the composition. One example of such a nucleating agent is an inorganic crystalline compound, such as boron-containing compounds (e.g., boron nitride, sodium tetraborate, potassium tetraborate, calcium tetraborate, etc.), alkaline earth metal carbonates (e.g., calcium magnesium carbonate), oxides (e.g., titanium oxide, aluminum oxide, magnesium oxide, zinc oxide, antimony trioxide, etc.), silicates (e.g., talc, sodium-aluminum silicate, calcium silicate, magnesium silicate, etc.), salts of alkaline earth metals (e.g., calcium carbonate, calcium sulfate, etc.), and so forth. Boron nitride (BN) has been found to be particularly beneficial when employed in the thermoplastic composition of the present invention. Boron nitride exists in a variety of different crystalline forms (e.g., h-BN—hexagonal, c-BN—cubic or spharlerite, and w-BN—wurtzite), any of which can generally be employed in the present invention. The hexagonal crystalline form is particularly suitable due to its stability and softness.

Another suitable additive that may be employed to improve the mechanical properties of the composition is an impact modifier. Examples of suitable impact modifiers may include, for instance, polyepoxides, polyurethanes, polybutadiene, acrylonitrile-butadiene-styrene, polysiloxanes etc., as well as mixtures thereof. In one particular embodiment, a polyepoxide modifier is employed that contains at least two oxirane rings per molecule. The polyepoxide may be a linear or branched, homopolymer or copolymer (e.g., random, graft, block, etc.) containing terminal epoxy groups, skeletal oxirane units, and/or pendent epoxy groups. The monomers employed to form such polyepoxides may vary. In one particular embodiment, for example, the polyepoxide modifier contains at least one epoxy-functional (meth)acrylic monomeric component. The term "(meth)acrylic" includes acrylic and methacrylic monomers, as well as salts or esters thereof, such as acrylate and methacrylate monomers. Suitable epoxy-functional (meth)acrylic monomers may include, but are not limited to, those containing 1,2-epoxy groups, such as glycidyl acrylate and glycidyl methacrylate. Other suitable epoxy-functional monomers include allyl glycidyl ether, glycidyl ethacrylate, and glycidyl itoconate.

If desired, additional monomers may also be employed in the polyepoxide to help achieve the desired melt viscosity. Such monomers may vary and include, for example, ester monomers, (meth)acrylic monomers, olefin monomers, amide monomers, etc. In one particular embodiment, for example, the polyepoxide modifier includes at least one linear or branched α-olefin monomer, such as those having from 2 to 20 carbon atoms and preferably from 2 to 8 carbon atoms. Specific examples include ethylene, propylene, 1-butene; 3-methyl-1-butene; 3,3-dimethyl-1-butene; 1-pentene; 1-pentene with one or more methyl, ethyl or propyl substituents; 1-hexene with one or more methyl, ethyl or propyl substituents; 1-heptene with one or more methyl, ethyl or propyl substituents; 1-octene with one or more methyl, ethyl or propyl substituents; 1-nonene with one or more methyl, ethyl or propyl substituents; ethyl, methyl or dimethyl-substituted 1-decene; 1-dodecene; and styrene. Particularly desired α-olefin comonomers are ethylene and propylene. In one particularly desirable embodiment of the present invention, the polyepoxide modifier is a copolymer formed from an epoxy-functional (meth)acrylic monomeric component and α-olefin monomeric component. For example, the polyepoxide modifier may be poly(ethylene-co-glycidyl methacrylate). One specific example of a suitable polyepoxide modifier that may be used in the present invention is commercially available from Arkema under the name Lotader® AX8840. Lotader® AX8950 has a melt flow rate of 5 g/10 min and has a glycidyl methacrylate monomer content of 8 wt. %.

Still another suitable additive that may be employed to improve the mechanical properties of the thermoplastic composition is an organosilane coupling agent. The coupling agent may, for example, be any alkoxysilane coupling agent as is known in the art, such as vinlyalkoxysilanes, epoxyalkoxysilanes, aminoalkoxysilanes, mercaptoalkoxysilanes, and combinations thereof. Aminoalkoxysilane compounds typically have the formula: $R^5$—Si—$(R^6)_3$, wherein $R^5$ is selected from the group consisting of an amino group such as $NH_2$; an aminoalkyl of from about 1 to about 10 carbon atoms, or from about 2 to about 5 carbon atoms, such as aminomethyl, aminoethyl, aminopropyl, aminobutyl, and so forth; an alkene of from about 2 to about 10 carbon atoms, or from about 2 to about 5 carbon atoms, such as ethylene, propylene, butylene, and so forth; and an alkyne of from about 2 to about 10 carbon atoms, or from about 2 to about 5 carbon atoms, such as ethyne, propyne, butyne and so forth; and wherein $R^6$ is an alkoxy group of from about 1 to about 10 atoms, or from about 2 to about 5 carbon atoms, such as methoxy, ethoxy, propoxy, and so forth. In one embodiment, $R^5$ is selected from the group consisting of aminomethyl, aminoethyl, aminopropyl, ethylene, ethyne, propylene and propyne, and $R^6$ is selected from the group consisting of methoxy groups, ethoxy groups, and propoxy groups. In another embodiment, $R^5$ is selected from the group consisting of an alkene of from about 2 to about 10 carbon atoms such as ethylene, propylene, butylene, and so forth, and an alkyne of from about 2 to about 10 carbon atoms such as ethyne, propyne, butyne and so forth, and $R^6$ is an alkoxy group of from about 1 to about 10 atoms, such as methoxy group, ethoxy group, propoxy group, and so forth. A combination of various aminosilanes may also be included in the mixture.

Some representative examples of aminosilane coupling agents that may be included in the mixture include aminopropyl triethoxysilane, aminoethyl triethoxysilane, aminopropyl trimethoxysilane, aminoethyl trimethoxysilane, ethylene trimethoxysilane, ethylene triethoxysilane, ethyne trimethoxysilane, ethyne triethoxysilane, aminoethylaminopropyltrimethoxysilane, 3-aminopropyl triethoxysilane, 3-aminopropyl trimethoxysilane, 3-aminopropyl methyl dimethoxysilane or 3-aminopropyl methyl diethoxysilane, N-(2-aminoethyl)-3-aminopropyl trimethoxysilane, N-methyl-3-aminopropyl trimethoxysilane, N-phenyl-3-aminopropyl trimethoxysilane, bis(3-aminopropyl)tetramethoxysilane, bis(3-aminopropyl)tetraethoxy disiloxane, and combinations thereof. The amino silane may also be an aminoalkoxysilane, such as γ-aminopropyltrimethoxysilane, γ-aminopropyltriethoxysilane, γ-aminopropylmethyldimethoxysilane, γ-aminopropylmethyldiethoxysilane, N-(β-aminoethyl)-γ-aminopropyltrimethoxysilane, N-phenyl-γ-aminopropyltrimethoxysilane, γ-diallylaminopropyltrimethoxysilane and γ-diallylaminopropyltrimethoxysilane. One suitable amino silane is 3-aminopropyltriethoxysilane which is available from Degussa, Sigma Chemical Company, and Aldrich Chemical Company.

Lubricants may also be employed in the thermoplastic composition that are capable of withstanding the processing conditions of poly(arylene sulfide) (typically from about 290° C. to about 320° C.) without substantial decomposition. Exemplary of such lubricants include fatty acids esters, the salts thereof, esters, fatty acid amides, organic phosphate esters, and hydrocarbon waxes of the type commonly used as lubricants in the processing of engineering plastic materials, including mixtures thereof. Suitable fatty acids typically have a backbone carbon chain of from about 12 to about 60 carbon atoms, such as myristic acid, palmitic acid, stearic acid, arachic acid, montanic acid, octadecinic acid, parinric acid, and so forth. Suitable esters include fatty acid esters, fatty alcohol esters, wax esters, glycerol esters, glycol esters and complex esters. Fatty acid amides include fatty primary amides, fatty secondary amides, methylene and ethylene bisamides and alkanolamides such as, for example, palmitic acid amide, stearic acid amide, oleic acid amide, N,N'-ethylenebisstearamide and so forth. Also suitable are the metal salts of fatty acids such as calcium stearate, zinc stearate, magnesium stearate, and so forth; hydrocarbon waxes, including paraffin waxes, polyolefin and oxidized polyolefin waxes, and microcrystalline waxes. Particularly suitable lubricants are acids, salts, or amides of stearic acid, such as pentaerythritol tetrastearate, calcium stearate, or N,N'-ethylenebisstearamide. When employed, the lubricant(s) typically constitute from about 0.05 wt. % to about 1.5 wt. %, and in some embodiments, from about 0.1 wt. % to about 0.5 wt. % of the thermoplastic composition.

Still other additives that can be included in the composition may include, for instance, antimicrobials, pigments, antioxidants, stabilizers, surfactants, waxes, flow promoters, solid solvents, and other materials added to enhance properties and processability.

II. Melt Processing

The manner in which the polyarylene sulfide, disulfide, filler, and other optional additives are combined may vary as is known in the art. For instance, the materials may be supplied either simultaneously or in sequence to a melt processing device that dispersively blends the materials. Batch and/or continuous melt processing techniques may be employed. For example, a mixer/kneader, Banbury mixer, Farrel continuous mixer, single-screw extruder, twin-screw extruder, roll mill, etc., may be utilized to blend and melt process the materials. One particularly suitable melt processing device is a co-rotating, twin-screw extruder (e.g., Leistritz co-rotating fully intermeshing twin screw extruder). Such extruders may include feeding and venting ports and provide high intensity distributive and dispersive mixing. For example, the polyarylene sulfide, disulfide, and filler may be fed to the same or different feeding ports of a twin-screw extruder and melt blended to form a substantially homogeneous melted mixture. Melt blending may occur under high shear/pressure and heat to ensure sufficient dispersion. For example, melt processing may occur at a temperature of from about 50° C. to about 500° C., and in some embodiments, from about 100° C. to about 250° C. Likewise, the apparent shear rate during melt processing may range from about 100 seconds$^{-1}$ to about 10,000 seconds$^{-1}$, and in some embodiments, from about 500 seconds$^{-1}$ to about 1,500 seconds$^{-1}$. Of course, other variables, such as the residence time during melt processing, which is inversely proportional to throughput rate, may also be controlled to achieve the desired degree of homogeneity.

Regardless of the manner in which they are combined together, the present inventors have discovered that the thermoplastic composition may possess a relatively low melt viscosity, which allows it to readily flow into the mold cavity during production of the part. For instance, the composition may have a melt viscosity of about 2500 poise or less, in some embodiments about 2000 poise or less, and in some embodiments, from about 400 to about 1500 poise, as determined by a capillary rheometer at a temperature of about 310° C. and shear rate of 1200 seconds$^{-1}$. Among other things, these viscosity properties can allow the composition to be readily injection molded into parts having very small dimensions. In contrast to the melt viscosity of the thermoplastic composition, the melt viscosity of the starting polyarylene sulfide that is supplied to the extruder can be quite high. Melt processing can, however, lower than the melt viscosity of the starting polyarylene sulfide in the manner described above. The ratio of the melt viscosity of the starting polyarylene sulfide to that of the thermoplastic composition can be greater than about 1.25, greater than about 2, or greater than about 3. For instance, the melt viscosity of the starting polyarylene sulfide may be greater than about 2,500 poise, greater than about 3,000 poise, or greater than about 3,500 poise as determined in accordance with ISO Test No. 11443 at a shear rate of 1200 $s^{-1}$ and at a temperature of 310° C.

Due to the ability of the present invention to reduce viscosity during melt processing, the present inventors have discovered that relatively high molecular weight polyarylene sulfides can be fed to the extruder with little difficulty. For example, such high molecular weight polyarylene sulfides may have a number average molecular weight of about 14,000 grams per mole ("g/mol") or more, in some embodiments about 15,000 g/mol or more, and in some embodiments, from about 16,000 g/mol to about 60,000 g/mol, as well as weight average molecular weight of about 35,000 g/mol or more, in some embodiments about 50,000 g/mol or more, and in some embodiments, from about 60,000 g/mol to about 90,000 g/mol, as determined using gel permeation chromatography as described below. Such high molecular weight polymers generally have a low chlorine content, both before and after melt processing. For instance, as noted above, the thermoplastic composition can have a chlorine content of about 1200 ppm or less, in some embodiments about 900 ppm or less, in some embodiments from 0 to about 600 ppm, and in some embodiments, from about 1 to about 500 ppm.

In addition, the crystallization temperature (prior to molding) of the thermoplastic composition may about 250° C. or less, in some embodiments from about 100° C. to about 245° C., and in some embodiments, from about 150° C. to about 240° C. The melting temperature of the thermoplastic composition may also range from about 250° C. to about 320° C., and in some embodiments, from about 260° C. to about 300° C. The melting and crystallization temperatures may be determined as is well known in the art using differential scanning calorimetry in accordance with ISO Test No. 11357. Even at such melting temperatures, the ratio of the deflection temperature under load ("DTUL"), a measure of short term heat resistance, to the melting temperature may still remain relatively high. For example, the ratio may range from about 0.65 to about 1.00, in some embodiments from about 0.70 to about 0.99, and in some embodiments, from about 0.80 to about 0.98. The specific DTUL values may, for instance, range from about 200° C. to about 300° C., in some embodiments from about 230° C. to about 290° C., and in some embodiments, from about 250° C. to about 280° C. Such high DTUL values can, among other things, allow the use of high speed processes often employed during the manufacture of components having a small dimensional tolerance.

The thermoplastic composition of the present invention has also been found to possess excellent mechanical properties. For example, the composition may possess a high impact strength, which is useful when forming small parts. The composition may, for instance, possess an Izod notched impact strength greater than about 2 $kJ/m^2$, in some embodiments from about 3 to about 40 $kJ/m^2$, and in some embodiments, from about 4 to about 30 $kJ/m^2$, measured at 23° C. according to ISO Test No. 180) (technically equivalent to ASTM D256, Method A). The tensile and flexural mechanical properties of the composition are also good. For example, the thermoplastic composition may exhibit a tensile strength of from about 20 to about 500 MPa, in some embodiments from about 50 to about 400 MPa, and in some embodiments, from about 100 to about 350 MPa; a tensile break strain of about 0.5% or more, in some embodiments from about 0.6% to about 10%, and in some embodiments, from about 0.8% to about 3.5%; and/or a tensile modulus of from about 5,000 MPa to about 25,000 MPa, in some embodiments from about 8,000 MPa to about 22,000 MPa, and in some embodiments, from about 10,000 MPa to about 20,000 MPa. The tensile properties may be determined in accordance with ISO Test No. 527 (technically equivalent to ASTM D638) at 23° C. The thermoplastic composition may also exhibit a flexural strength of from about 20 to about 500 MPa, in some embodiments from about 50 to about 400 MPa, and in some embodiments, from about 100 to about 350 MPa; a flexural break strain of about 0.5% or more, in some embodiments from about 0.6% to about 10%, and in some embodiments, from about 0.8% to about 3.5%; and/or a flexural modulus of from about 5,000 MPa to about 25,000 MPa, in some embodiments from about 8,000 MPa to about 22,000 MPa, and in some embodiments, from about 10,000 MPa to about 20,000 MPa. The flexural properties may be determined in accordance with ISO Test No. 178 (technically equivalent to ASTM D790) at 23° C.

III. Injection Molding

As indicated above, the thermoplastic composition is injection molded for use in a housing of a portable electronic device. For example, as is known in the art, injection can occur in two main phases—i.e., an injection phase and holding phase. During the injection phase, the mold cavity is completely filled with the molten thermoplastic composition. The holding phase is initiated after completion of the injection phase in which the holding pressure is controlled to pack additional material into the cavity and compensate for volumetric shrinkage that occurs during cooling. After the shot has built, it can then be cooled. Once cooling is complete, the molding cycle is completed when the mold opens and the part is ejected, such as with the assistance of ejector pins within the mold.

Any suitable injection molding equipment may generally be employed in the present invention. Referring to FIG. 1, for example, one embodiment of an injection molding apparatus or tool 10 that may be employed in the present invention is shown. In this embodiment, the apparatus 10 includes a first mold base 12 and a second mold base 14, which together define an article or component-defining mold cavity 16. The molding apparatus 10 also includes a resin flow path that extends from an outer exterior surface 20 of the first mold half 12 through a sprue 22 to a mold cavity 16. The resin flow path may also include a runner and a gate, both of which are not shown for purposes of simplicity. The thermoplastic composition may be supplied to the resin flow path using a variety of techniques. For example, the thermoplastic composition may be supplied (e.g., in the form of pellets) to a feed hopper attached to an extruder barrel that contains a rotating screw (not shown). As the screw rotates, the pellets are moved forward and undergo pressure and friction, which generates heat to melt the pellets. Additional heat may also be supplied to the composition by a heating medium that is communication with the extruder barrel. One or more ejector pins 24 may also be employed that are slidably secured within the second mold half 14 to define the mold cavity 16 in the closed position of the apparatus 10. The ejector pins 24 operate in a well-known fashion to remove a molded part from the cavity 16 in the open position of the molding apparatus 10. A cooling mechanism may also be provided to solidify the resin within the mold cavity. In FIG. 1, for instance, the mold bases 12 and 14 each include one or more cooling lines 18 through which a cooling medium flows to impart the desired mold temperature to the surface of the mold bases for solidifying the molten material. The mold temperature may be from about 50° C. to about 150° C., in some embodiments from about 60° C. to about 140° C., and in some embodiments, from about 70° C. to about 130° C.

Regardless of the molding technique employed, it has been discovered that the thermoplastic composition of the present invention, which possesses the unique combination of high flowability, low chlorine content, and good mechanical properties, is particularly well suited for the thin molded parts used in the housings of portable electronic devices. For example, the part may have a thickness of about 100 millimeters or less, in some embodiments about 50 millimeters or less, in some embodiments from about 100 micrometers to about 10 millimeters, and in some embodiments, from about 200 micrometers to about 1 millimeter.

Examples of portable electronic devices that may employ such a molded part in or as its housing include, for instance, cellular telephones, portable computers (e.g., laptop computers, netbook computers, tablet computers, etc.), wrist-watch devices, headphone and earpiece devices, media players with wireless communications capabilities, handheld computers (also sometimes called personal digital assistants), remote controllers, global positioning system (GPS) devices, handheld gaming devices, camera modules, integrated circuits (e.g., SIM cards), etc. Wireless portable electronic devices are particularly suitable. Examples of such devices may include a laptop computer or small portable computer of the type that is sometimes referred to as "ultraportables." In one suitable arrangement, the portable electronic device may be a handheld electronic device. The device may also be a hybrid device that combines the functionality of multiple conventional devices. Examples of hybrid devices include a cellular telephone that includes media player functionality, a gaming device that includes a wireless communications capability, a cellular telephone that includes game and email functions, and a handheld device that receives email, supports mobile telephone calls, has music player functionality and supports web browsing.

Figure 2:
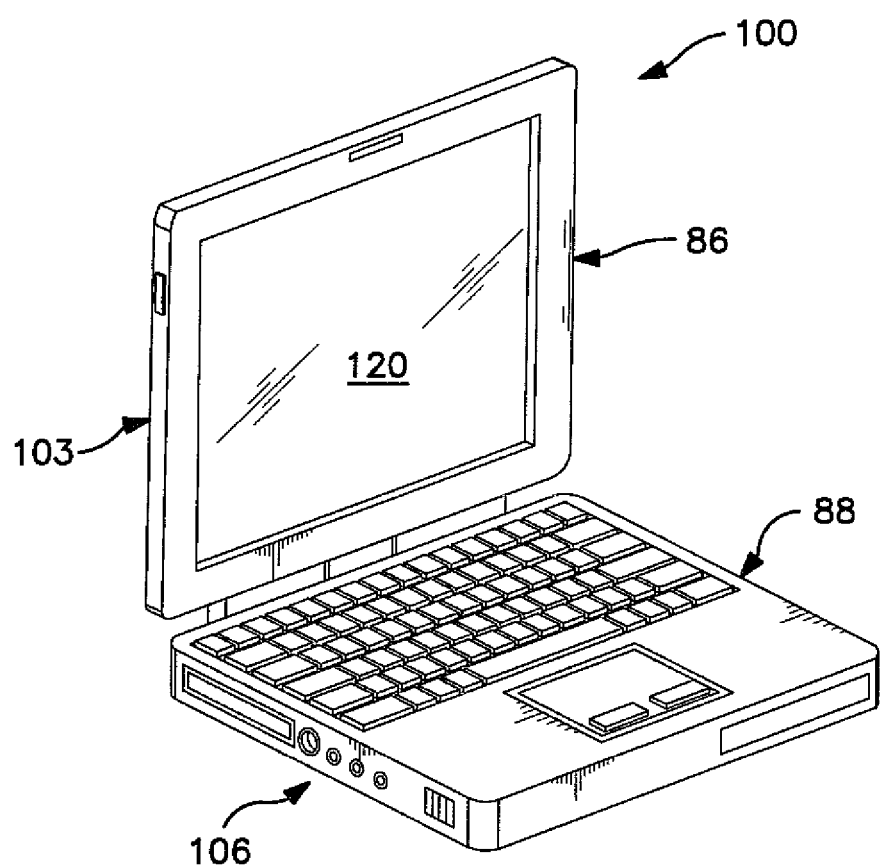
FIG. 2 is a perspective view of one embodiment of the portable electronic device that can be formed in accordance with the present invention.
Figure 3:
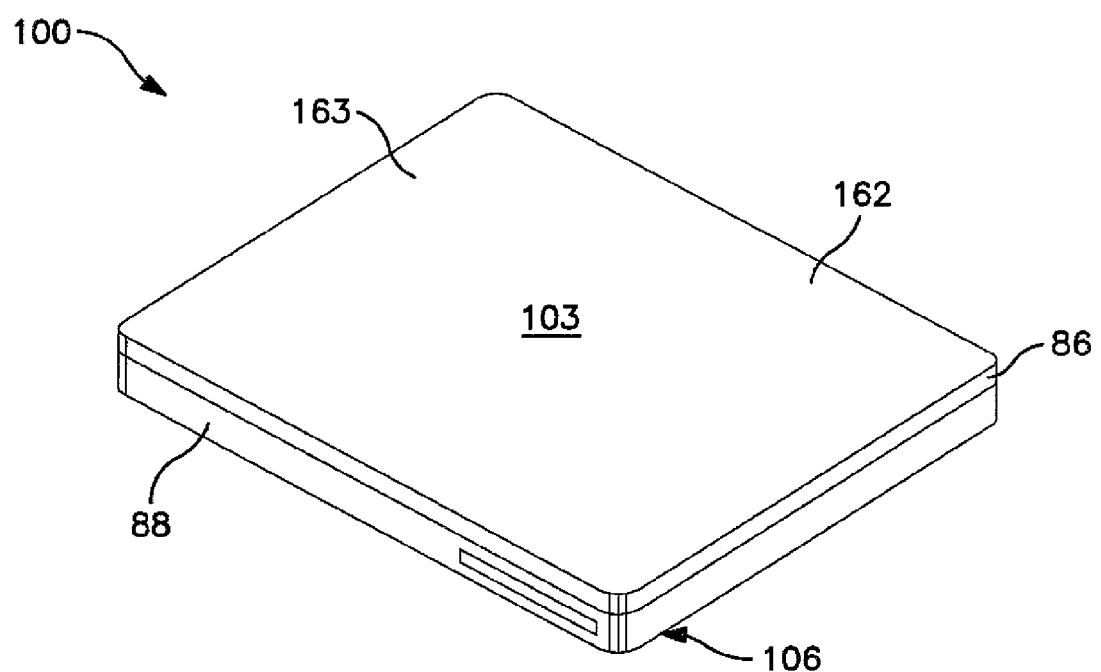
FIG. 3 is a perspective view of the portable electronic device of FIG. 2, shown in a closed configuration.

Referring to FIGS. 2-3, one particular embodiment of a portable electronic device 100 is shown as a portable computer. The electronic device 100 includes a display member 103, such as a liquid crystal diode (LCD) display, an organic light emitting diode (OLED) display, a plasma display, or any other suitable display. In the illustrated embodiment, the device is in the form of a laptop computer and so the display member 103 is rotatably coupled to a base member 106. It should be understood, however, that the base member 106 is optional and can be removed in other embodiments, such as when device is in the form of a tablet portable computer. Regardless, in the embodiment shown in FIGS. 2-3, the display member 103 and the base member 106 each contain a housing 86 and 88, respectively, for protecting and/or supporting one or more components of the electronic device 100. The housing 86 may, for example, support a display screen 120 and the base member 106 may include cavities and interfaces for various user interface components (e.g., keyboard, mouse, and connections to other peripheral devices). Although not expressly shown, the device 100 may also contain circuitry as is known in the art, such as storage, processing circuitry, and input-output components. Wireless transceiver circuitry in circuitry may be used to transmit and receive radio-frequency (RF) signals. Communications paths such as coaxial communications paths and microstrip communications paths may be used to convey radio-frequency signals between transceiver circuitry and antenna structures. A communications path may be used to convey signals between the antenna structure and circuitry. The communications path may be, for example, a coaxial cable that is connected between an RF transceiver (sometimes called a radio) and a multiband antenna.

Although the molded part of the present invention may generally be employed in any portion of the electronic device 100, it is typically employed to form all or a portion of the housing 86 and/or 88. When the device is a tablet portable computer, for example, the housing 88 may be absent and the thermoplastic composition may be used to form all or a portion of the housing 86. Regardless, due to the unique properties achieved by the present invention, the housing(s) or a feature of the housing(s) may be molded to have a very small thickness, such as within the ranges noted above.

The present invention may be better understood with reference to the following examples.

TEST METHODS

Molecular Weight:

The samples were analyzed using a Polymer Labs GPC-220 size exclusion chromatograph. The instrument was controlled by Precision Detector software installed on a Dell computer system. The analysis of the light scattering data was performed using the Precision Detector software and the conventional GPC analysis was done using Polymer Labs Cirrus software. The GPC-220 contained three Polymer Labs PLgel 10 μm MIXED-B columns running chloronaphthalene as the solvent at a flow rate of 1 ml/min at 220° C. The GPC contains three detectors: Precision Detector PD2040 (static light scattering); Viscotek 220 Differential Viscometer; and a Polymer Labs refractometer. For analysis of the molecular weight and molecular weight distribution using the RI signal, the instrument was calibrated using a set of polystyrene standards and plotting a calibration curve.

Melt Viscosity:

The melt viscosity is determined as scanning shear rate viscosity and determined in accordance with ISO Test No. 11443 (technically equivalent to ASTM D3835) at a shear rate of $1200\ s^{-1}$ and at a temperature of about 310° C. using a Dynisco 7001 capillary rheometer. The rheometer orifice (die) had a diameter of 1 mm, a length of 20 mm, an L/D ratio of 20.1, and an entrance angle of 180°. The diameter of the barrel was 9.55 mm+0.005 mm and the length of the rod was 233.4 mm.

Tensile Modulus, Tensile Stress, and Tensile Elongation:

Tensile properties are tested according to ISO Test No. 527 (technically equivalent to ASTM D638). Modulus and strength measurements are made on the same test strip sample having a length of 80 mm, thickness of 10 mm, and width of 4 mm. The testing temperature is 23° C., and the testing speeds are 1 or 5 mm/min.

Flexural Modulus, Flexural Stress, and Flexural Strain:

Flexural properties are tested according to ISO Test No. 178 (technically equivalent to ASTM D790). This test is performed on a 64 mm support span. Tests are run on the center portions of uncut ISO 3167 multi-purpose bars. The testing temperature is 23° C. and the testing speed is 2 mm/min.

Izod Notched Impact Strength:

Notched Izod properties are tested according to ISO Test No. 180 (technically equivalent to ASTM D256, Method A). This test is run using a Type A notch. Specimens are cut from the center of a multi-purpose bar using a single tooth milling machine. The testing temperature is 23° C.

Deflection Under Load Temperature ("DTUL"):

The deflection under load temperature is determined in accordance with ISO Test No. 75-2 (technically equivalent to ASTM D648-07). A test strip sample having a length of 80 mm, thickness of 10 mm, and width of 4 mm is subjected to an edgewise three-point bending test in which the specified load (maximum outer fibers stress) is 1.8 MPa. The specimen is lowered into a silicone oil bath where the temperature is raised at 2° C. per minute until it deflects 0.25 mm (0.32 mm for ISO Test No. 75-2).

Chlorine Content:

Chlorine content was determined according to an elemental analysis analysis using Parr Bomb combustion followed by Ion Chromatography.

Fiber Length:

Starting fiber lengths were as reported from the fiber source. Final fiber lengths were reported as average fiber length and were determined by use of a scanning electron microscope.

EXAMPLE 1

The components listed in Table 1 below are mixed in a Werner Pfleiderer ZSK 25 co-rotating intermeshing twin-screw extruder with a 25 mm diameter.

TABLE 1

| Sample No. | 1 | 2 | 3 | 4 | 5 | 6 |
|---|---|---|---|---|---|---|
| Glycolube ® P | 0.3% | 0.3% | 0.3% | 0.3% | 0.3% | 0.3% |
| Diphenyl disulfide | — | — | 0.4% | 0.2% | 0.2% | — |
| 2,2'-dithiobenzoic acid | — | — | — | — | — | 0.2% |
| Aminosilane | — | 0.4% | — | 0.2% | — | 0.2% |
| Mercaptosilane | — | — | — | — | 0.2% | — |
| Suzorite mica | 30% | 30% | 30% | 30% | 30% | 30% |
| Glass fibers (4 mm) | 20.0% | 20.0% | 20.0% | 20.0% | 20.0% | 20.0% |
| Forton ® 0214 (Mn = 17,431, Mw = 62,230) | 49.7% | 49.3% | 49.3% | 49.3% | 49.3% | 49.3% |

The extruded pellets were tested for ash content and viscosity, with results described in Table 2, below.

TABLE 2

| Sample No. | 1 | 2 | 3 | 4 | 5 | 6 |
|---|---|---|---|---|---|---|
| Ash % | 49.86 | 50.00 | 49.81 | 49.71 | 48.44 | 48.25 |
| Melt viscosity (poise) | 2747 | 3587 | 764 | 1160 | 1342 | 2434 |

The pellets are also injection molded on a Mannesmann Demag D100 NCIII injection molding machine and tested for certain physical characteristics, as described in Table 3 below.

TABLE 3

| Sample No. | 1 | 2 | 3 | 4 | 5 | 6 |
|---|---|---|---|---|---|---|
| Tensile Modulus (MPa) | 16237 | 17176 | 16936 | 17740 | 16182 | 16542 |
| Tensile stress (MPa) | 106.00 | 129.11 | 114.92 | 128.19 | 124.07 | 122.45 |
| Tensile elongation (%) | 1.24 | 1.15 | 1.25 | 1.22 | 1.24 | 1.25 |
| Flexural Modulus 23° C. (MPa) | 15996 | 16562 | 16915 | 16778 | 16372 | 16752 |
| Flexural Stress (MPa) | 173.1 | 196.8 | 176.5 | 192.4 | 186.4 | 188.9 |
| Flexural Strain (%) | 1.47 | 1.44 | 1.33 | 1.40 | 1.37 | 1.37 |
| Izod Notched Impact Strength (kJ/m$^2$) | 4.7 | 4.5 | 4.2 | 4.2 | 5.2 | 4.7 |
| DTUL at 1.8 MPa (° C.) | 250.7 | 252.9 | 265 | 262.8 | 266.4 | 257.4 |
| Chlorine content (ppm) | 790 | 500 | 550 | 640 | 810 | 920 |
| Fiber length (mm) | 0.20 | 0.20 | 0.24 | 0.22 | — | — |

In the sample that did not include either the disulfide additive or the silane additive (Sample 1), the thermal and mechanical properties were relatively poor. When the silane additive was included without the disulfide additive (Sample 2), the deflection temperature under load was relatively poor because the melt viscosity of the sample was high and this caused glass fiber abrasion (shorter glass fiber length). Such a high melt viscosity may cause processing issues for certain applications. When the disulfide compound was added (Samples 3, 4, 5, and 6), the deflection temperature under load improved while still maintaining a good melt viscosity for processing.

EXAMPLE 2

The components listed in Table 4 below are mixed in a Werner Pfleiderer ZSK 25 co-rotating intermeshing twin-screw extruder with a 25 mm diameter.

TABLE 4

| | Sample No. | |
|---|---|---|
| | 7 | 8 |
| Glycolube ® P | 0.3% | 0.3% |
| Diphenyl disulfide | — | 0.2% |
| Aminosilane coupling agent | 0.4% | 0.4% |
| Glass fibers (4 mm) | 40% | 40% |
| Fortron ® 0205 (Mn = 16,155, Mw = 58,228) | 59.3% | — |
| Forton ® 0214 (Mn = 17,431, Mw = 62,230) | — | 59.1% |

The extruded pellets were tested for ash content and melt viscosity, with results summarized in Table 5.

TABLE 5

| | Sample No. | |
|---|---|---|
| | 7 | 8 |
| Ash % | 40.81 | 40.57 |
| Melt viscosity | 2592 | 2537 |

The pellets are also injection molded on a Mannesmann Demag D100 NCIII injection molding machine and tested for certain physical characteristics, as described in Table 6 below.

TABLE 6

| | Sample No. | |
|---|---|---|
| | 7 | 8 |
| Tensile Modulus (MPa) | 15736 | 15233 |
| Tensile stress (MPa) | 194 | 199 |
| Tensile elongation (%) | 1.58 | 1.90 |
| Flexural Modulus 23° C. (MPa) | 14625 | 14254 |
| Flexural Stress (MPa) | 278 | 285 |
| Flexural Strain (%) | 2.01 | 2.21 |
| Izod Notched Impact Strength (kJ/m$^2$) | 9.8 | 9.3 |
| Chlorine content (ppm) | 1400 | 680 |

As can be seen in Table 6, the inclusion of the disulfide provided a sample with good mechanical properties, and a lower chlorine content than the sample formed from the low molecular weight polyarylene sulfide.

EXAMPLE 3

The components listed in Table 7 below are mixed in a Werner Pfleiderer ZSK 25 co-rotating intermeshing twin-screw extruder with a 25 mm diameter.

TABLE 7

| | Sample No. | | |
|---|---|---|---|
| | 9 | 10 | 11 |
| Glycolube ® P | 0.3% | 0.3% | 0.3% |
| 2,2'-dithiobenzoic acid | — | 0.3% | — |
| Diphenyl disulfide | — | — | 0.3% |
| Lotador ® Ax-8840 EGMA Copolymer | 8% | 8% | 8% |
| Glass fiber | 30% | 30% | 30% |
| Fortron ® 0202 (Mn = 16,090, Mw = 35,870) | 61.7% | — | — |
| Forton ® 0214 (Mn = 17,431, Mw = 62,230) | — | 61.4% | 61.4% |
| Total | 100% | 100% | 100% |

The extruded pellets were tested for ash content and melt viscosity, with the results summarized in Table 8.

TABLE 8

| | Sample No. | | |
|---|---|---|---|
| | 9 | 10 | 11 |
| Ash % | 30.34 | 30.21 | 30.31 |
| Melt viscosity | 1094 | 2746 | 2228 |

The pellets are also injection molded on a Mannesmann Demag D100 NCIII injection molding machine and tested for certain physical characteristics, as described in Table 9 below.

TABLE 9

| Characteristic | 009 | 010 | 011 |
|---|---|---|---|
| Tensile Modulus (MPa) | 9800 | 9550 | 9463 |
| Tensile stress (MPa) | 137.00 | 137.00 | 124.00 |
| Tensile elongation (%) | 1.90 | 2.28 | 1.80 |
| Flexural Modulus 23° C. (MPa) | 9000 | 8857.00 | 9083.00 |
| Flexural Stress (MPa) | 200.00 | 201.00 | 172.00 |
| Flexural Strain (%) | 2.49 | 2.59 | 2.12 |
| Izod Notched Impact Strength (kJ/m$^2$) | 10 ± 0.4 | 10.90 ± 0.90 | 9.70 ± 0.50 |
| Chlorine content (ppm) | 1500 | 570 | 920 |

The addition of the disulfide additive into the glass-filled formulation showed improvement in both impact strength and tensile elongation. It is believed that the crosslinking reaction between the functional disulfide and the impact modifier contributed to an increase in melt viscosity, though the melt viscosity was still suitable for melt processing.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An injection molded housing for a portable electronic device, wherein the housing comprises a thermoplastic composition, the thermoplastic composition containing a polyarylene sulfide that is melt processed in the presence of a disulfide compound, a filler, and an organosilane coupling agent, wherein the thermoplastic composition has a melt viscosity of about 2500 poise or less as determined in accordance with ISO Test No. 11443 at a shear rate of 1200 s$^{-1}$ and at a temperature of 310° C., wherein the melt viscosity of the thermoplastic composition is lower than the melt viscosity of the polyarylene sulfide, and wherein the composition has a chlorine content of about 1200 parts per million or less.

2. The injection molded housing of claim 1, wherein the thermoplastic composition has a chlorine content of from 0 to about 600 parts per million.

3. The injection molded housing of claim 1, wherein the polyarylene sulfide is a linear polyphenylene sulfide.

4. The injection molded housing of claim 1, wherein the polyarylene sulfide constitutes from about 30 wt. % to about 95 wt. % of the composition.

5. The injection molded housing of claim 1, wherein the disulfide compound constitutes from about 0.01 wt. % to about 3 wt. % of the composition.

6. The injection molded housing of claim 1, wherein the disulfide compound comprises the following structure: R3-S—S—R4, wherein R3 and R4 are the same or different and are nonreactive groups independently selected from the group consisting of alkyl, cycloalkyl, aryl, and heterocyclic groups, and wherein R3 and R4 independently comprise from 1 to about 20 carbon atoms.

7. The injection molded housing of claim 1, wherein the disulfide compound is diphenyl sulfide, diaminodiphenyl disulfide, 3,3'-diaminodiphenyl disulfide, 4,4'-diaminodiphenyl disulfide, dibenzyl disulfide, 2,2'-dithiobenzoic acid, dithioglycolic acid, α,α'-dithiodilactic acid, β,β'-dithiodilactic acid, 3,3'-dithiodipyridine, 4,4'dithiomorpholine, 2,2'-dithiobis(benzothiazole), 2,2'-dithiobis(benzimidazole), 2,2'-dithiobis(benzoxazole), 2-(4'-morpholinodithio)benzothiazole, or a combination thereof.

8. The injection molded housing of claim 1, wherein the filler constitutes from about 5 wt. % to about 80 wt. % of the composition.

9. The injection molded housing of claim 8, wherein the filler comprises fibrous fillers.

10. The injection molded housing of claim 9, wherein the fibrous filler includes glass fibers.

11. The injection molded housing of claim 8, wherein the filler comprises particulate fillers.

12. The injection molded housing of claim 11, wherein the particulate fillers include mineral fillers.

13. The injection molded housing of claim 1, wherein the thermoplastic composition further comprises a nucleating agent, an impact modifier, a lubricant, or a combination thereof.

14. The injection molded housing of claim 1, wherein the thermoplastic composition has a melt viscosity of from about 400 to about 1500 poise as determined in accordance with ISO Test No. 11443 at a shear rate of 1200 s$^{-1}$ and at a temperature of 310° C.

15. The injection molded housing of claim 1, wherein the thermoplastic composition has a deflection temperature under load of from about 200° C. to about 290° C., as determined in accordance with ISO Test No. 75-2 at a load of 1.8 MPa.

16. The injection molded housing of claim 1, wherein the thermoplastic composition has an Izod notched impact strength greater than about 2 kJ/m2, measured at 23° C. according to ISO Test No. 180.

17. The injection molded housing of claim 1, wherein the thermoplastic composition has a flexural modulus of from about 5,000 MPa to about 25,000 MPa, as determined in accordance with ISO Test No. 178 at 23° C.

18. The injection molded housing of claim 1, wherein the housing has a thickness of about 100 millimeters or less.

19. A portable electronic device that comprises the injection molded housing of claim 1.

20. The portable electronic device of claim 19, wherein the device is a cellular telephone, portable computer, wrist-watch device, a headphone or earpiece device, media player with wireless communications capabilities, handheld computer, remote controller, global positioning system, handheld gaming device, camera module, or a combination thereof.

21. A portable computer that comprises a housing that includes a display member, wherein at least a portion of the housing contains a molded part having a thickness of about 100 millimeters or less, wherein the molded part is formed from a thermoplastic composition containing a polyarylene sulfide, a disulfide compound, a filler, and an organosilane coupling agent, wherein the composition has a chlorine content of about 1200 parts per million or less and wherein the melt viscosity of the thermoplastic composition is lower than the melt viscosity of the polyarylene sulfide and wherein the melt viscosity is determined in accordance with ISO Test No. 11443 at a shear rate of 1200 s$^{-1}$ and at a temperature of 310° C.

22. The portable computer of claim 21, wherein the thermoplastic composition has a melt viscosity of about 2500 poise or less as determined in accordance with ISO Test No. 11443 at a shear rate of 1200 s$^{-1}$ and at a temperature of 310° C.

23. The portable computer of claim 21, wherein the thermoplastic composition has a chlorine content of from 0 to about 600 parts per million.

24. The portable computer of claim 21, wherein the polyarylene sulfide is a linear polyphenylene sulfide.

25. The portable computer of claim 21, wherein the polyarylene sulfide constitutes from about 30 wt. % to about 95 wt. % of the thermoplastic composition, the disulfide compound constitutes from about 0.01 wt. % to about 3 wt. % of the thermoplastic composition, and the filler constitutes from about 5 wt. % to about 80 wt. % of the thermoplastic composition.

26. The portable computer of claim 21, wherein the disulfide compound is diphenyl sulfide, diaminodiphenyl disulfide, 3,3'-diaminodiphenyl disulfide, 4,4'-diaminodiphenyl disulfide, dibenzyl disulfide, 2,2'-dithiobenzoic acid, dithioglycolic acid, α,α'-dithiodilactic acid, β,β'-dithiodilactic acid, 3,3'-dithiodipyridine, 4,4'dithiomorpholine, 2,2'-dithiobis(benzothiazole), 2,2'-dithiobis(benzimidazole), 2,2'-dithiobis(benzoxazole), 2-(4'-morpholinodithio)benzothiazole, or a combination thereof.

27. The portable computer of claim 21, wherein the filler includes fibrous fillers.

28. The portable computer of claim 27, wherein the fibrous filler includes glass fibers.

29. The portable computer of claim 21, wherein the filler includes particulate fillers.

30. The portable computer of claim 19, wherein the particulate fillers include mineral fillers.

31. The portable computer of claim 21, wherein the computer is in the form of a laptop computer in which the display member is rotatably coupled to a base member.

32. The portable computer of claim 21, wherein the computer is in the form of a tablet computer.

33. The injection molded housing of claim 1, wherein the ratio of the melt viscosity of the polyarylene sulfide to the melt viscosity of the thermoplastic composition is greater than about 1.25.

* * * * *